United States Patent
Jeon et al.

(10) Patent No.: US 7,310,015 B2
(45) Date of Patent: *Dec. 18, 2007

(54) TEMPERATURE-COMPENSATED CIRCUIT FOR POWER AMPLIFIER USING DIODE VOLTAGE CONTROL

(75) Inventors: Jooyoung Jeon, Gyeonggi-do (KR); Junghyun Kim, Seoul (KR)

(73) Assignee: Avago Technologies Wireless IP Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 10/905,659

(22) Filed: Jan. 14, 2005

(65) Prior Publication Data

US 2006/0055447 A1 Mar. 16, 2006

(30) Foreign Application Priority Data

Sep. 14, 2004 (KR) ................. 10-2004-0073492

(51) Int. Cl.
*G05F 3/02* (2006.01)
*H03F 3/04* (2006.01)

(52) U.S. Cl. ..................... 327/538; 330/289

(58) Field of Classification Search ........ 327/512–513, 327/538, 541–543, 545–546; 330/266–267, 330/272, 289

See application file for complete search history.

(56) References Cited

U.S. PATENT DOCUMENTS

| | | | |
|---|---|---|---|
| 3,944,874 A | * | 3/1976 | Murley, Jr. ................. 345/69 |
| 4,924,194 A | * | 5/1990 | Opas et al. ................. 330/289 |
| 5,152,004 A | | 9/1992 | Vaisanen et al. |
| 5,175,871 A | | 12/1992 | Kunkel |

(Continued)

FOREIGN PATENT DOCUMENTS

CN 1324143 11/2001

(Continued)

OTHER PUBLICATIONS

German Office Action dated May 2, 2007 of German Patent Application No. 112004002745.4-35.

(Continued)

*Primary Examiner*—Kenneth B. Wells
*Assistant Examiner*—Ryan C. Jager
(74) *Attorney, Agent, or Firm*—Townsend and Townsend and Crew LLP

(57) ABSTRACT

Provided is a temperature-compensated circuit for a power amplifier through diode voltage control, in which a first resistor (Rref), a first diode (D1), and a second diode (D2) are connected to a reference voltage in series. The temperature-compensated circuit includes a second resistor (R1) connected to the reference voltage, a third resistor (R2) connected to the second resistor in series, a fourth resistor (Rc) having one terminal connected to the reference voltage, a fifth resistor (Re) having one terminal connected to ground, a bias transistor having a base terminal connected to a contact point (VS) between the second resistor and the third resistor, a collector terminal connected to the other terminal of the fourth resistor, and an emitter terminal connected to the other terminal of the fifth resistor, and a sixth resistor (Rf) connected between a series connection terminal between the first diode and the second diode, and the collector terminal of the bias transistor. The voltage of the collector terminal changes for compensation of a temperature.

14 Claims, 9 Drawing Sheets

U.S. PATENT DOCUMENTS

| | | |
|---|---|---|
| 5,276,912 A | 1/1994 | Siwiak et al. |
| 5,530,923 A | 6/1996 | Heinonen et al. |
| 5,661,434 A | 8/1997 | Brozovich et al. |
| 5,758,269 A | 5/1998 | Wu |
| 5,909,643 A | 6/1999 | Aihara |
| 6,060,949 A | 5/2000 | Kaufman et al. |
| 6,069,526 A | 5/2000 | Ballantyne |
| 6,130,589 A | 10/2000 | Yamaguchi et al. |
| 6,205,318 B1 | 3/2001 | Schindler et al. |
| 6,356,150 B1 | 3/2002 | Spears et al. |
| 6,363,685 B1 | 4/2002 | Kugler |
| 6,374,116 B1 | 4/2002 | Peterzell et al. |
| 6,487,419 B1 | 11/2002 | Freed |
| 6,556,082 B1 * | 4/2003 | Wang et al. ............ 330/288 |
| 6,603,359 B2 | 8/2003 | Fujiwara et al. |
| 6,674,323 B2 | 1/2004 | Kagaya et al. |
| 6,700,439 B2 | 3/2004 | Jackson |
| 6,781,455 B2 | 8/2004 | Kim |
| 6,806,775 B2 * | 10/2004 | Abe ............................ 330/297 |
| 6,809,587 B2 | 10/2004 | Ghannouchi et al. |
| 6,992,524 B2 * | 1/2006 | Yang et al. .................. 327/540 |
| 2006/0077001 A1 * | 4/2006 | Jeon et al. .................. 327/538 |

FOREIGN PATENT DOCUMENTS

| | | |
|---|---|---|
| DE | 3902871 A1 | 8/1990 |
| DE | 10102891 | 11/2001 |
| JP | 2001326537 | 11/2001 |
| KR | 20010105151 | 11/2001 |
| TW | 507427 | 10/2002 |

OTHER PUBLICATIONS

English Translation of German Office Action dated May 2, 2007 of German Patent Application No. 112004002745.4-35.

* cited by examiner

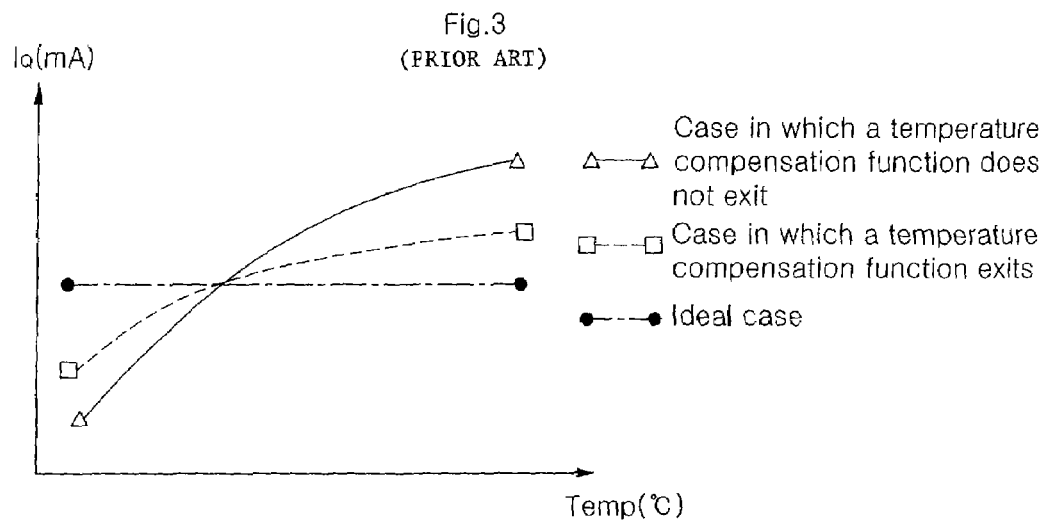
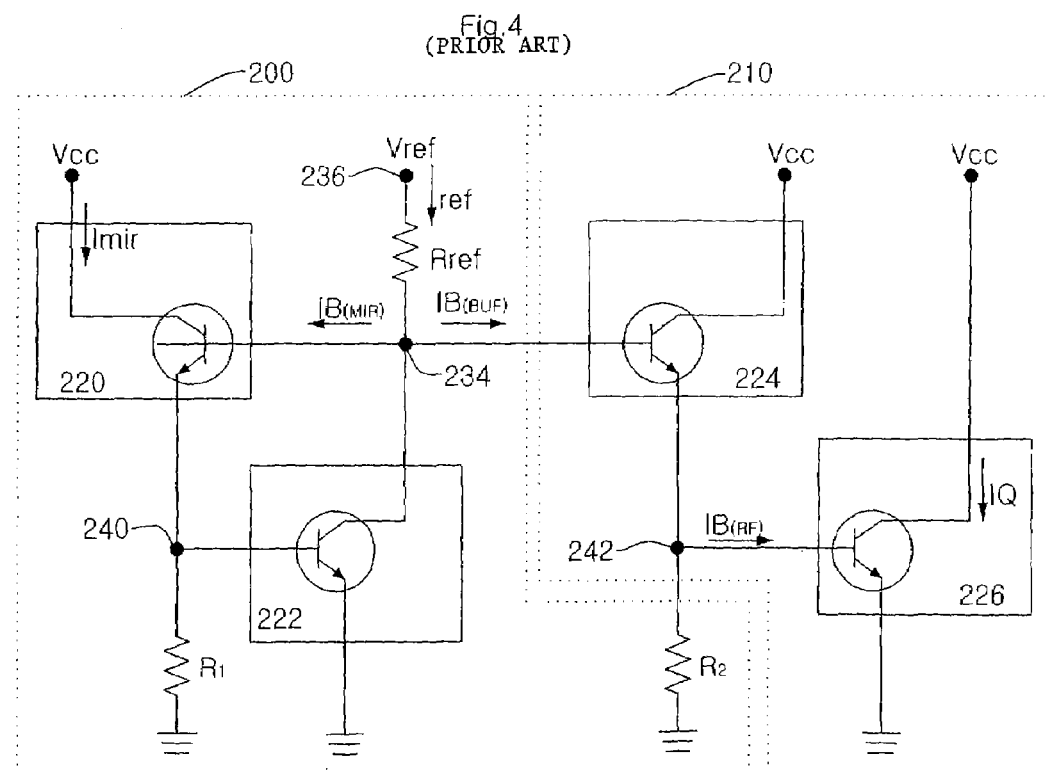

△——△ Case in which a temperature compensation function does not exit

○——○ Case in which a temperature is compensated with respect to a high temperature(mode2)

□--□ Case in which a temperature is compensated with respect to the room temperature(mode1)

●--● Case in which a temperature is compensated with respect to a low temperature(mode3)

..... Case in which compensation does not exist

___ Case in which compensation exists

..... Case in which compensation does not exist

___ Case in which compensation exists

TEMPERATURE-COMPENSATED CIRCUIT FOR POWER AMPLIFIER USING DIODE VOLTAGE CONTROL

This application claims priority under 35 U.S.C. § 119 to Korean patent application number 10-2004-0073492, filed Sep. 14, 2004, which is incorporated by reference along with all other references cited in this application.

BACKGROUND OF THE INVENTION

1. Field of the Invention

The present invention relates to a power amplifier included in a personal portable communication device such as a cellular phone or a personal digital assistant (PDA), and more particularly, to a temperature-compensated circuit for a power amplifier.

2. Description of the Related Art

With the development of electronic technologies, portable electronic apparatuses are efficiently designed and costly effectively manufactured. The portable electronic apparatuses largely include pagers, cellular phones, music players, calculators, laptop computers, and PDAs. The portable electronic apparatuses generally require DC power and one or more batteries are used as an energy source for supplying DC power.

Wireless portable communication terminals such as mobile handsets or cellular phones are becoming compact and light. Accordingly, the size of a battery occupying a considerable portion of the mobile handset is becoming smaller to fit into the mobile handset that is compact and light. In case of the cellular phone, along with smaller terminal and battery, longer talk time is required. Thus, the life of the battery is an important factor in the mobile communication terminals such as mobile handsets or cellular phones.

The temperature in use of these personal wireless communication apparatuses changes according to a change of a season, the operation of an amplifier, or an operation duration time. Maintaining a particular feature of a power amplifier in spite of the change in temperature is another important factor in determining performance of the terminal.

A bias circuit to compensate for a temperature is needed for a superior amplification operation of a power amplifier in an appropriate operation range in spite of the change in temperature. According to a conventional technology, a circuit as shown in FIG. 1 is used for the bias of a power amplifier.

FIG. 1 is a circuit diagram of a bias circuit of a conventional power amplifier. Referring to FIG. 1, a transistor Q2 is a simplified form of an amplification end of a power amplifier. A transistor Q1 is a bias transistor, or a DC buffer transistor, which provides a bias voltage to a base of the transistor Q2. Since the transistor Q1 compensates for insufficient current applied to the transistor Q2 when a bias voltage $V_Y$ is directly input to the base of the transistor Q2, it is referred to as a DC buffer transistor. In FIG. 1, a power voltage Vcc is applied to the transistors Q2 and Q1 while a reference voltage Vref is applied to a resistor Rref of a bias circuit block 200. A collector static operational current of the transistor Q2 is indicated by static operational current $I_Q$.

Prior to the description of the conventional invention, the typical current characteristic of a diode needs to be understood. Those skilled in the art would easily understand that the current characteristic of a typical diode is identical to that according to a base-emitter voltage of a transistor.

FIG. 2 is a graph showing that the characteristic of current according to a voltage between both ends of a diode or the characteristic of current according to the base-emitter voltage of a transistor, with a parameter of temperature. In FIG. 2, as the temperature increases, a characteristic curve moves to the left so that a diode turn-on voltage $V_{BE}(on)$ decreases. As it is well known, the movement of the curve has a value of about $-2$ mV/°C. When the bias voltage Vbias is constant, the effective base-emitter voltage is that $V_{BE}(eff)=Vbias-V_{BE}(on)$ so that the current increases.

Next, in the temperature compensation operation of the conventional bias circuit block 200 of FIG. 1, it is assumed that a voltage of a $V_Y$ node is designed to be 2.6V by the resistor Rref and two diodes D1 and D2 at the room temperature of about 25° C. This means that a value of the resistor Rref is set such that the voltage between both ends of each of the two diodes connected in series becomes 1.3 V.

The voltage between the base-emitter of the transistors Q1 and Q2 is 1.3 V like the diodes D1 and D2.

When an operation temperature increases, in the transistors Q1 and Q2, as shown in FIG. 2, the base-emitter turn-on voltage $V_{BE}(on)$ decreases so that the static operational current $I_Q$ increases. However, since the diodes D1 and D2 have the same temperature dependency as the transistors Q1 and Q2, the voltage $V_Y$ decreases accordingly. The decrease of the voltage $V_Y$ means a decrease in the base-emitter voltage of the transistors Q1 and Q2. Also, since the effective voltage $V_{BE}(eff)$ between the base-emitter voltage of the transistors Q1 and Q2 does not change, the static operational current $I_Q$ is constant.

When the operation temperature decreases, the base-emitter turn-on voltage $V_{BE}(on)$ of in the transistors Q1 and Q2 increases so that the static operational current $I_Q$ decreases. However, since the diodes D1 and D2 have the same temperature dependency as the transistors Q1 and Q2, the voltage $V_Y$ increases accordingly. The increase of the voltage $V_Y$ means an increase in the base voltage of the transistors Q1 and Q2. Also, since the effective voltage $V_{BE}(eff)$ between the base-emitter voltage of the transistors Q1 and Q2 does not change, the static operational current $I_Q$ is constant.

To summarize the above operation, the voltage $V_Y$ between both ends of each of the diodes D1 and D2 tracks the base-emitter turn-on voltage of the transistors Q1 and Q2 according to the change in temperature so that the effective voltage $V_{BE}(eff)$ is constantly maintained. Thus, in spite of the change in temperature, the static operational current $I_Q$ is contact.

However, practically, when the $V_Y$ voltage drops to about 2.4V, the voltage between both ends of the base-emitter of each of the transistors Q1 and Q2 automatically decreases to about 1.2V. However, in this case, the static operational current $I_Q$ of the transistor Q2 increases greater than the size at the room temperature. This is because the sizes of the transistors Q1 and Q2 driving a large amount of current are much greater than those of the diodes D1 and D2 so that the dependency on temperature is not the same. Thus, it is a problem that the voltage $V_Y$ must be less than 2.4V to perform accurate temperature compensation so that the static operational current IQ of the transistor Q2 is constantly maintained.

When the operation temperature drops lower than the room temperature, the voltage $V_Y$ increases by the temperature dependency intrinsic to the diodes D1 and D2. When the voltage $V_Y$ increases to about 2.8V, the voltage between both ends of the base-emitter of each of the transistors Q1 and Q2 automatically increases to about 1.4V. Accordingly, the static operational current $I_Q$ of the transistor Q2 decreases compared to the current at the room temperature. For the same reason in a case in which the temperature increases, in order to perform accurate temperature compensation by which the static operational current $I_Q$ of the transistor Q2 is constantly maintained, a problem in which the voltage $V_Y$ must be greater than the static operational current $I_Q$ occurs. FIG. 3 is a graph showing the static operational current IQ when the temperature compensation function is insufficient due to the above problem in comparison with the static operational current $I_Q$ in an ideal state.

A variety of circuit techniques have been developed to solve a problem in which maintaining the static operational current $I_Q$ of the transistor Q2 constantly by the temperature compensation function based on the temperature dependency of the diodes D1 and D2 is difficult. One of the circuit techniques is that the voltage between both ends of each of the diodes D1 and D2 connected in series is arbitrarily and appropriately changed according to a change in temperature to provide a more ideal static operational current $I_Q$ feature.

Referring to FIG. 4, one of the conventional techniques having an additional temperature compensation function is described. This circuit includes a bias circuit block 200 and an amplifier block 210. In the configuration of the circuit, a transistor 226 shows part of an amplification circuit amplifying an RF signal and a transistor 224 is a DC buffer transistor and a resistor R2 DC-biases a base of the transistor 226.

The bias circuit block 200 has the same elements as the amplifier block 210 to form a current mirror shape. A transistor 220 and a transistor 222 make mirrored pairs with the transistor 224 and the transistor 226, respectively, while a resistor R1 makes a mirrored pair with the resistor R2.

A voltage of a node 234 flows from a base of the transistor 220 via the transistor 222 to ground so that a voltage drop is $2V_{BE}$. The resistor R1 is connected to a base node 240 of the transistor 222. A DC reference voltage Vref is connected to one side of a resistor Rref and current flowing between both ends of the resistor Rref is Iref.

When the operation temperature increases, the base-emitter turn-on voltage $V_{BE}(on)$ of the transistor 222 decreases. However, since current Imir is almost constantly maintained, the voltage of the node 240 is almost constantly maintained. Thus, an effective voltage between the base-emitter of the transistor 222 increases so that collector current of the transistor 222 increases and the voltage of the node 234 drops. When the voltage of the node 234 drops, the voltage of a node 242 drops automatically. Thus, since the effective voltage between the base-emitter of the transistor 226 is constant, a change in the static operational current $I_Q$ is restricted.

When the operation temperature decreases, the base-emitter turn-on voltage $V_{BE}(on)$ of the transistor 222 increases. However, since the current Imir is almost constantly maintained, the voltage of the node 240 is almost constantly maintained. Thus, the effective voltage between the base-emitter of the transistor 222 decreases so that the collector current of the transistor 222 decreases and the voltage of the node 234 increases. When the voltage of the node 234 increases, the voltage of a node 242 increases automatically. Thus, since the effective voltage between the base-emitter of the transistor 226 is constant, a change in the static operational current $I_Q$ is restricted.

In addition, as a conventional technology to finely adjust a voltage applied to diodes of a bias circuit, U.S. Pat. No. 6,566,954 describes an additional compensation function to a temperature compensation function of a bias circuit in which an active device instead of a resistor is inserted in a transistor amplifying an RF signal.

U.S. Pat. No. 6,452,454 describes a technology of an additional temperature compensation function by additionally providing a plurality of diodes in parallel or current paths in the bias circuit to adjust the amount of current flowing from the reference voltage Vref.

U.S. Pat. No. 6,556,082 describes another circuit technology enabling additional temperature compensation function, which is achieved by adding resistors and adjusting ratio between the resistors.

U.S. Pat. No. 6,424,225 describes a technology in which additional circuits are provided to operate according to a change in temperature so that reference current supplied from the bias circuit can be increased or decreased, thus enabling additional temperature compensation in a wider range.

SUMMARY OF THE INVENTION

To solve the above problems, the present invention provides a temperature-compensated circuit for a power amplifier having a circuit to control a diode voltage of a bias circuit to compensation for a temperature of the power amplifier.

According to an aspect of the present invention, a temperature-compensated circuit for a power amplifier through diode voltage control, in which a first resistor (Rref), a first diode (D1), and a second diode (D2) are connected to a reference voltage in series, the temperature-compensated circuit comprising: a second resistor (R1) connected to the reference voltage; a third resistor (R2) connected to the second resistor in series; a fourth resistor (Rc) having one terminal connected to the reference voltage; a fifth resistor (Re) having one terminal connected to ground; a bias transistor having a base terminal connected to a contact point (VS) between the second resistor and the third resistor, a collector terminal connected to the other terminal of the fourth resistor, and an emitter terminal connected to the other terminal of the fifth resistor; and a sixth resistor (Rf) connected between a series connection terminal between the first diode and the second diode, and the collector terminal of the bias transistor, wherein the voltage of the collector terminal changes for compensation of a temperature.

According to another aspect of the present invention, a temperature-compensated circuit for a power amplifier through diode voltage control, in which a first resistor (Rref), a first diode (D1), and a second diode (D2) are connected to a reference voltage in series, the temperature-compensated circuit comprising: a third diode (D3) connected to the reference voltage; a second resistor (R1) connected to the third diode; a third resistor (R2) connected to the second resistor in series; a fourth resistor (Rc) having one terminal connected to the reference voltage; a fifth resistor (Re) having one terminal connected to ground; a bias transistor having a base terminal connected to a contact point (VS) between the second resistor and the third resistor, a collector terminal connected to the other terminal of the fourth resistor, and an emitter terminal connected to the other terminal of the fifth resistor; and a sixth resistor (Rf) connected between a series connection terminal between the first diode and the second diode, and the collector terminal of the bias transistor, wherein the voltage of the collector terminal changes for compensation of a temperature.

According to another aspect of the present invention, a temperature-compensated circuit for a power amplifier through diode voltage control, in which a first resistor (Rref), a first diode (D1), and a second diode (D2) are connected to a reference voltage in series, the temperature-compensated circuit comprising: a second resistor (R1) connected to the reference voltage; a third resistor (R2) connected to the second resistor in series; a fourth resistor (Rc1) having one terminal connected to the reference voltage; a fifth resistor (Rc2) connected to the fourth resistor in series; a sixth resistor (Re) having one terminal connected to ground; a bias transistor having a base terminal connected to a contact point (VS) between the second resistor and the third resistor, a collector terminal connected to the fifth resistor, and an emitter terminal connected to the other terminal of the sixth resistor; and a seventh resistor (Rf) connected between a series connection terminal between the first diode and the second diode, and a series connection terminal between the fourth resistor and the fifth resistor, wherein the voltage of the collector terminal changes for compensation of a temperature.

According to another aspect of the present invention, a temperature-compensated circuit for a power amplifier through diode voltage control, in which a first resistor (Rref), a first diode (D1), and a second diode (D2) are connected to a reference voltage in series, the temperature-compensated circuit comprising: a third diode (D3) connected to the reference voltage; a second resistor (R1) connected to the third diode; a third resistor (R2) connected to the second resistor in series; a fourth resistor (Rc1) having one terminal connected to the reference voltage; a fifth resistor (Rc2) connected to the fourth resistor in series; a sixth resistor (Re) having one terminal connected to ground; a bias transistor having a base terminal connected to a contact point (VS) between the second resistor and the third resistor, a collector terminal connected to the fifth resistor Rc2, and an emitter terminal connected to the other terminal of the sixth resistor; and a seventh resistor (Rf) connected between a series connection terminal between the first diode and the second diode, and a series connection terminal between the fourth resistor and the fifth resistor, wherein the voltage of the collector terminal changes for compensation of a temperature.

BRIEF DESCRIPTION OF THE DRAWINGS

The above and other features and advantages of the present invention will become more apparent by describing in detail preferred embodiments thereof with reference to the attached drawings in which:

FIG. 3 is a graph showing the result of comparison between the static operational current $I_Q$ when the temperature compensation capability is insufficient and the static operational current $I_Q$ in an ideal state;

FIG. 4 is a circuit diagram of a conventional bias circuit of a power amplifier having an additional temperature compensation function;

DETAILED DESCRIPTION OF THE INVENTION

Figure 1:
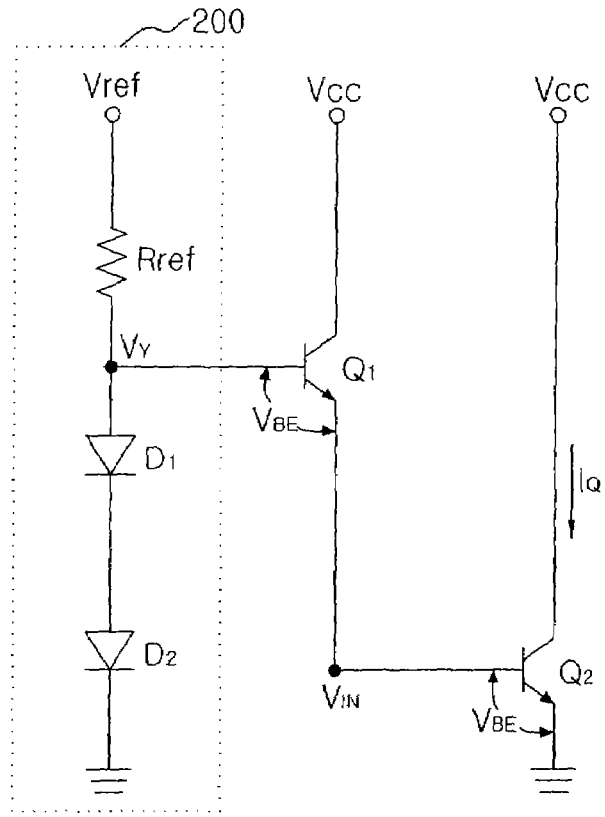
FIG. 1 is a circuit diagram of a conventional bias circuit of a power amplifier.
Figure 2:
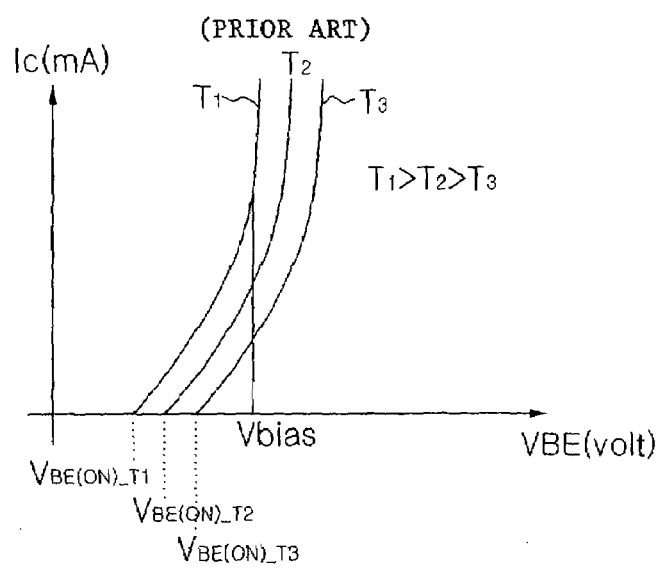
FIG. 2 is a graph showing the relationship between the base-emitter voltage and the current of a diode or a transistor.
Figure 5:
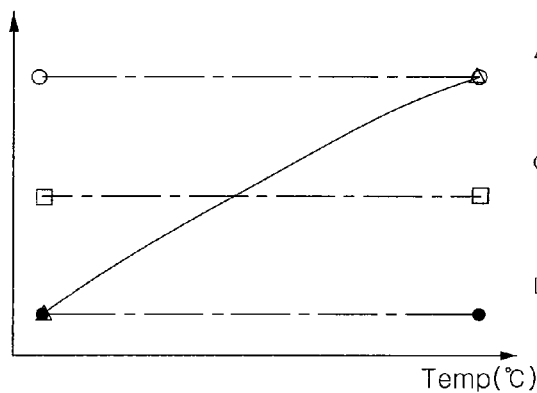
FIG. 5 is a graph showing the static operational current $I_Q$ of a bias circuit according to an embodiment of the present invention.

In the present invention, the additional temperature compensation in a wider range is possible, as shown in FIG. 5, by designing a circuit which operates to absorb reference current when temperature increases and source reference current when temperature decreases.

The present invention includes methods of maintaining a value of the static operational current $I_Q$ at the room temperature as shown in a curve shown in FIG. 5 (Mode 1), maintaining the value of the static operational current $I_Q$ at the highest temperature within a range allowed by the specification (Mode 2), and continuously maintaining the value of the static operational current $I_Q$ at the lowest temperature within the range allowed by the specification (Mode 3).

In Mode1, current at a lower/higher temperature with respect to the room temperature is up/down. In Mode 2, current at a relatively lower temperature with respect to a higher temperature is up. In Mode 3, current at a relatively higher temperature with respect to a lower temperature is down.

Figure 6:
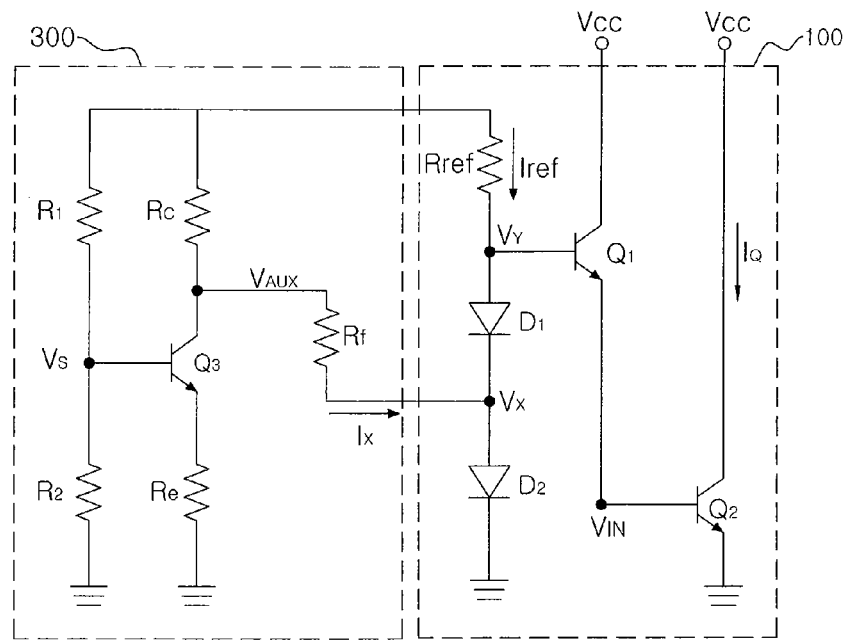
FIG. 6 is a circuit diagram of a temperature-compensated circuit for a power amplifier through diode voltage control according to an embodiment of the present invention.

FIG. 6 is a circuit diagram of a temperature-compensated circuit for a power amplifier through diode voltage control according to an embodiment of the present invention, which consists of a power amplifier 100 having a temperature-compensated circuit and diode voltage control circuit 300.

The power amplifier 100 having a temperature-compensated circuit includes a first transistor Q1 DC-buffering according to an input signal and a second transistor Q2 controlling according to the first transistor Q1. The emitter terminal of the first transistor Q1 is connected to the base terminal of a second transistor Q2. A voltage Vcc is applied to the first and second transistors Q1 and Q2. A reference resistor Rref is connected to the base terminal of the first transistor Q1 and applies a bias voltage. A first diode D1 and a second diode D2 are connected in series between the base terminal of the first transistor Q1 and ground or earth and simultaneously set a bias voltage applied to the base terminal of the first transistor Q1 according to the rate of a resistance component value of the reference resistor Rref.

In the diode voltage control circuit 300, a contact point voltage Vs between voltage dividing resistors R1 and R2 is connected to the base of a third transistor Q3. A collector resistor Rc is connected to the collector of the third transistor Q3. An emitter resistor Re is connected to the emitter of the third transistor Q3. A resistor Rf is connected between the contact point voltage $V_{AUX}$ between the collector resistor Rc and the collector of the third resistor Q3, and a contact point voltage $V_X$ between the first and second diodes D1 and D2. The diode voltage control circuit 300 is a voltage dividing bias circuit to which the reference voltage Vref is applied.

The operation of the temperature-compensated circuit for a power amplifier through diode voltage control configured as shown in FIG. 6 is described based on operation modes 1, 2, and 3 according to a change in temperature.

(1) Operation Mode 1: Supply+Absorption Mode

First, when the temperature of the circuit is high with respect to the room temperature, since a decrease in the turn-on voltage of the second transistor Q2 remarkable compared to a decrease in the voltage $V_Y$ input to the base of the first transistor Q1 and the voltage $V_{IN}$ input to the base of the second transistor, the static operational current $I_Q$ increases. To restrict the increase in the static operational current $I_Q$ at the high temperature, the following operation occurs in the diode voltage control circuit 300.

If the contact point voltage Vs between the resistors R1 and R2 is constant regardless of the temperature, since the turn-on voltage of the third transistor Q3 decreases, the collector current of the transistor Q3 increases so that a voltage drop at the collector resistor Rc increases much. The contact point voltage $V_{AUX}$ between the collector resistor Rc and the collector terminal of the third transistor Q3 decreases.

The contact point voltage $V_X$ between the first diode D1 and the second diode D2 is greater than the contact point voltage $V_{AUX}$ between the collector resistor Rc and the collector terminal of the third transistor Q3. Part of the current flowing through the first diode D1 flows into the third transistor Q3 via the resistor Rf (Ix<0). Accordingly, as the voltages $V_X$, $V_Y$, and $V_{IN}$ decrease, the increase in the static operational current $I_Q$ is restricted. That is, when the temperature is higher than the room temperature, the diode voltage control circuit 300 absorbs part of the reference current Iref.

Second, when the temperature of the circuit is low and the contact point voltage Vs between the resistors R1 and R2 is constant, the turn-on voltage of the third transistor Q3 increases and the collector current of the third transistor Q3 decreases so that a voltage drop at the collector resistor Rc decreases. The contact point voltage $V_{AUX}$ between the collector resistor Rc and the collector terminal of the third transistor Q3 increases.

The contact point voltage $V_X$ between the first diode D1 and the second diode D2 is less than the contact point voltage $V_{AUX}$ between the collector resistor Rc and the collector terminal of the third transistor Q3. Part of the current flowing through the resistor Rc flows into the second diode D2 via the resistor Rf (Ix>0). Accordingly, as the voltages $V_X$, $V_Y$, and $V_{IN}$ increase, the increase in the static operational current $I_Q$ at a lower temperature is restricted. That is, when the temperature is lower than the room temperature, the diode voltage control circuit 300 supplies part of the current at both ends of the second diode D2.

(2) Operation Mode 2: Supply Mode

The temperature in all ranges in which the circuit operates may be lower than the maximum temperature allowed by the specification. Since the contact point voltage Vs between the resistors R1 and R2 is fixed at a relatively low temperature, the turn-on voltage of the third transistor Q3 increases and the collector current of the third transistor Q3 decreases. Thus, the contact point voltage $V_{AUX}$ between the collector resistor Rc and the collector terminal of the third transistor Q3 increases.

The contact point voltage $V_X$ between the first diode D1 and the second diode D2 is less than the contact point voltage $V_{AUX}$ between the collector resistor Rc and the collector terminal of the third transistor Q3. Part of the current flowing through the resistor Rc flows into the second diode D2 via the resistor Rf (Ix>0). Accordingly, the voltages $V_X$, $V_Y$, and $V_{IN}$ increase. Thus, the static operational current $I_Q$ to be decreased as the temperature decreases is maintained.

(3) Operation Mode 3: Absorption Mode

The temperature in all ranges in which the circuit operates may be higher than the maximum temperature allowed by the specification. Since the contact point voltage Vs between the resistors R1 and R2 is fixed at a relatively high temperature, the turn-on voltage of the third transistor Q3 decreases and the collector current of the third transistor Q3 increases. Thus, the contact point voltage $V_{AUX}$ between the collector resistor Rc and the collector terminal of the third transistor Q3 decreases.

The contact point voltage $V_X$ between the first diode D1 and the second diode D2 is greater than the contact point voltage $V_{AUX}$ between the collector resistor Rc and the collector terminal of the third transistor Q3. Part of the current flowing through the resistor Rref flows into the third transistor Q3 via the resistor Rf (Ix<0) so that the voltages $V_X$, $V_Y$, and $V_{IN}$ decrease. Thus, the static operational current $I_Q$ to be increased as the temperature increases is maintained.

Another function of the present invention is to constantly maintain the static operational current of a power amplifier regardless a change in the reference voltage Vref. The reference voltage Vref is an item included in the specification of a typical cellular phone and variation thereof to a degree is allowed. When the reference voltage Vref increases or decreases, the operational characteristic of the circuit shown in FIG. 6 is as follows.

First, when the reference voltage Vref increases, the contact point voltage Vs increases so that an increase in the voltage $V_Y$ is prevented.

Second, when the reference voltage Vref decreases, the contact point voltage Vs decreases so that, since the circuit operates like a low temperature-compensated circuit, a decrease in the voltage $V_Y$ is prevented.

Thus, the change of the characteristic of the power amplifier is reduced regardless of the increase and decrease of the reference voltage Vref.

Figure 7:
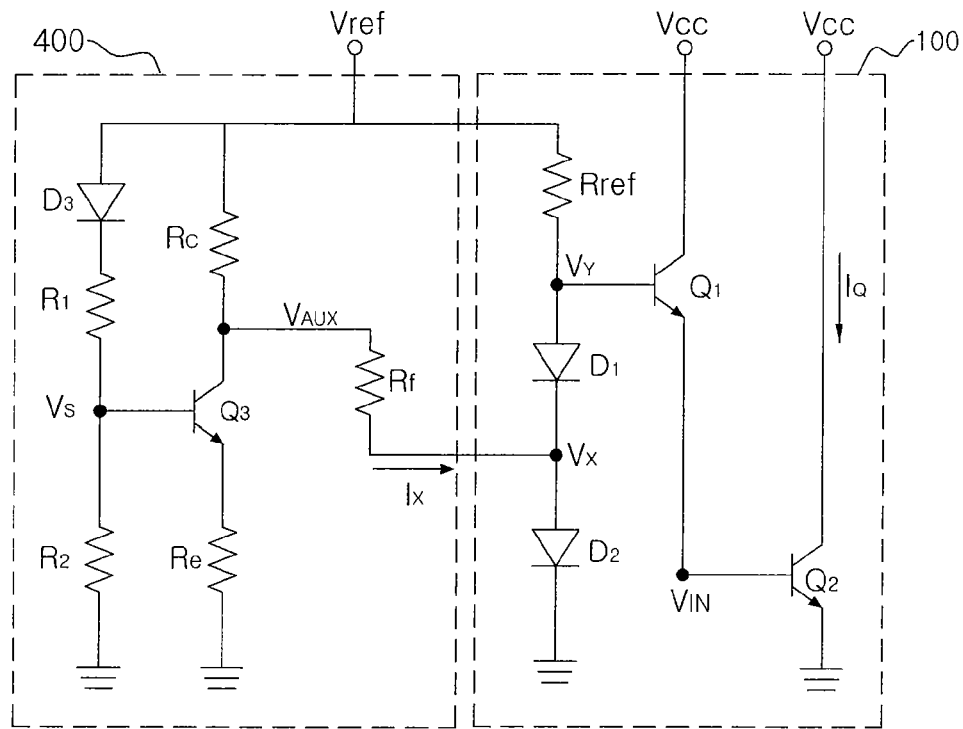
FIG. 7 is a circuit diagram of a temperature-compensated circuit for a power amplifier through diode voltage control according to another embodiment of the present invention.

FIG. 7 is a circuit diagram of a temperature-compensated circuit for a power amplifier through diode voltage control according to another embodiment of the present invention, which consists of the power amplifier 100 having a temperature-compensated circuit and a diode voltage control circuit 400.

Referring to FIG. 7, in the diode voltage control circuit 400, as a diode D3 is added at a front end of the voltage dividing resistor R1 at the diode voltage control circuit 300 of FIGS. 3 and 6, the voltage Vs changes. The voltages $V_X$ and $V_Y$ are changed so that the compensation of a temperature becomes smooth.

Thus, In the circuit shown in FIG. 7, the voltage Vs increases at a high temperature so that the current Q3 increases further. The voltage Vs decreases at a low temperature so that the current Q1 decreases further.

Figure 8:
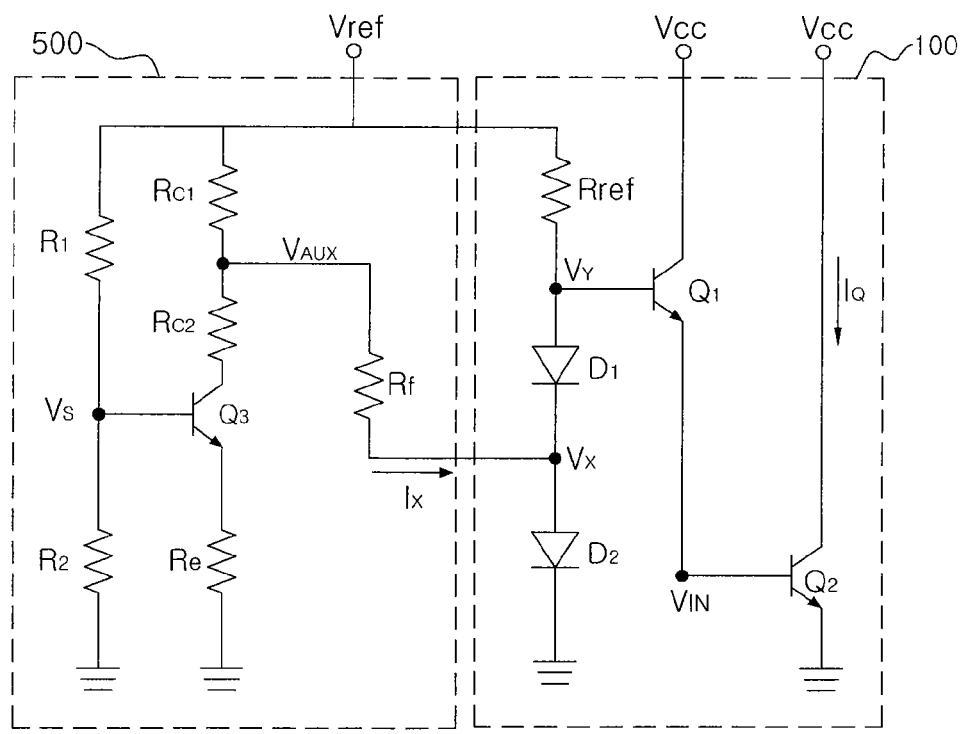
FIG. 8 is a circuit diagram of a temperature-compensated circuit for a power amplifier through diode voltage control according to yet another embodiment of the present invention.

FIG. 8 is a circuit diagram of a temperature-compensated circuit for a power amplifier through diode voltage control according to yet another embodiment of the present invention, which consists of the power amplifier 100 having a temperature-compensated circuit and a diode voltage control circuit 500.

The diode voltage control circuit 500, in which resistors Rc1 and Rc2 are added instead of the collector resistor Rc in the diode voltage control circuit 300 in FIGS. 3 and 5, can determine the voltage $V_{AUX}$ more finely by adjusting a ratio between the resistors Rc1 and Rc2.

Figure 9:
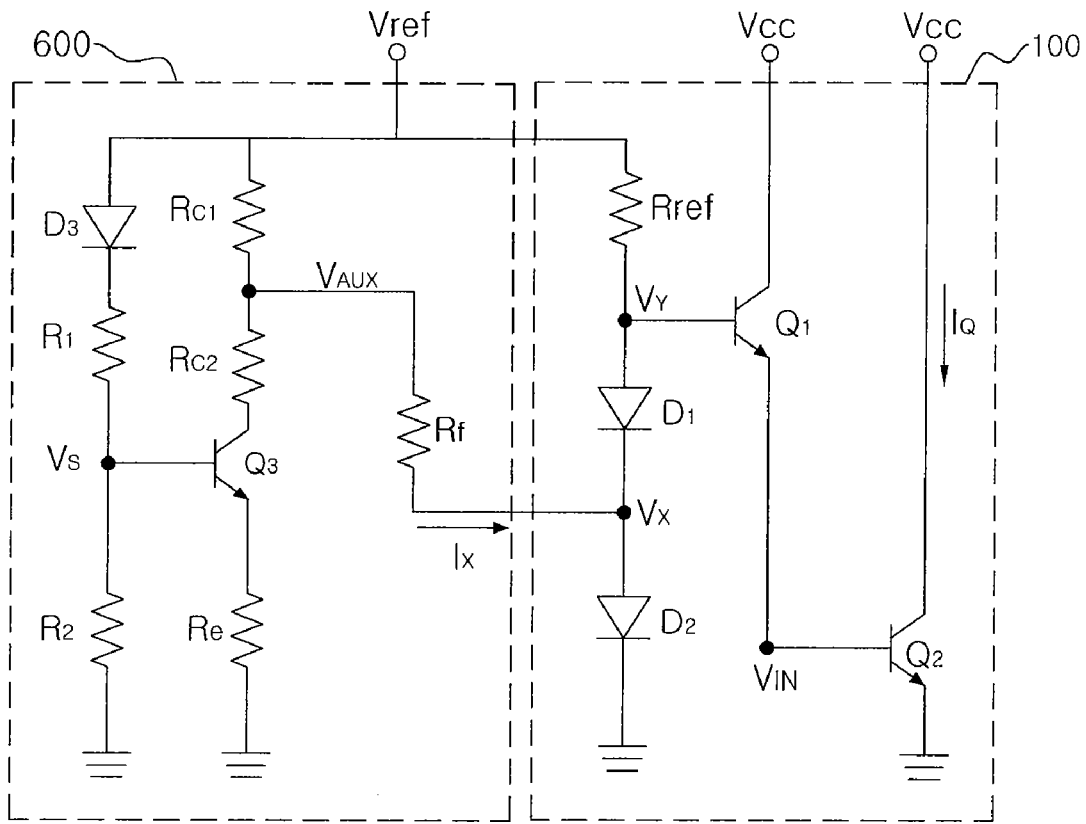
FIG. 9 is a circuit diagram of a temperature-compensated circuit for a power amplifier through diode voltage control according to still yet another embodiment of the present invention.

FIG. 9 is a circuit diagram of a temperature-compensated circuit for a power amplifier through diode voltage control according to still yet another embodiment of the present invention, which consists of the power amplifier 100 having a temperature-compensated circuit and a diode voltage control circuit 600.

In the diode voltage control circuit 600, as the diode D3 is added at the front end of the voltage dividing resistor R1 in the diode voltage control circuit 500 in FIG. 5, the voltage Vs changed according to the temperature. The voltages $V_X$ and $V_Y$ are changed so that the compensation of a temperature becomes smooth. The voltage $V_{AUX}$ can be determined more finely by adjusting a ratio between the resistors Rc1 and Rc2.

FIGS. 10 through 12 are graphs showing the operation modes of the temperature-compensated circuit for a power amplifier through diode voltage control according to the present invention.

Figure 10A:
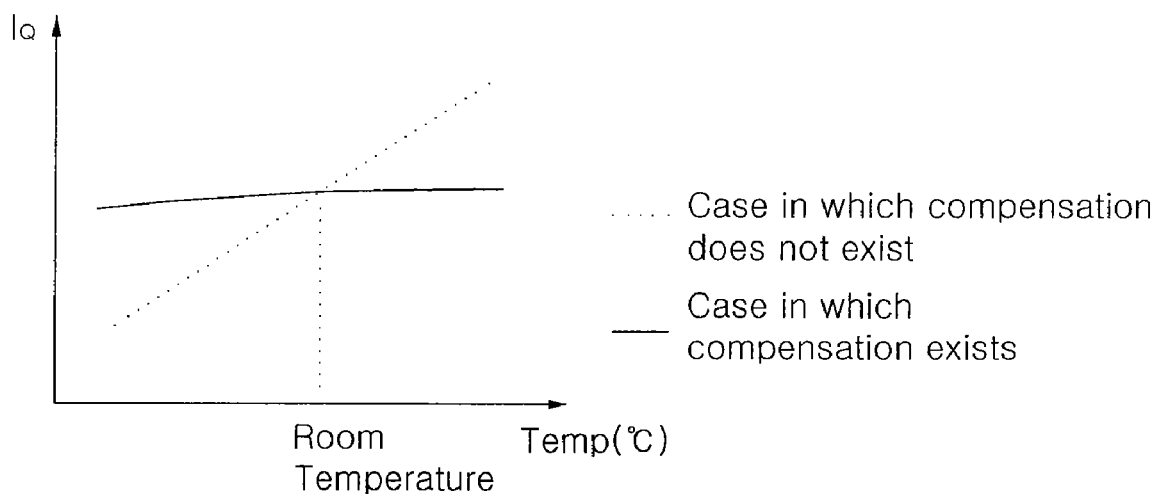
FIGS. 10 through 12 are graphs showing the operation modes of the temperature-compensated circuit for a power amplifier through diode voltage control according to the present invention.
Figure 10B:
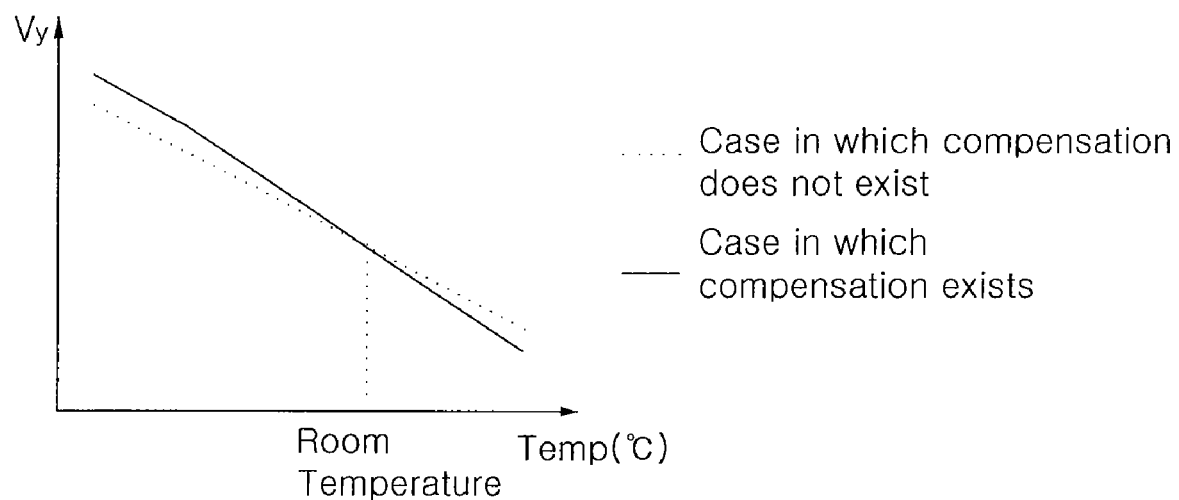
Figure 10C:
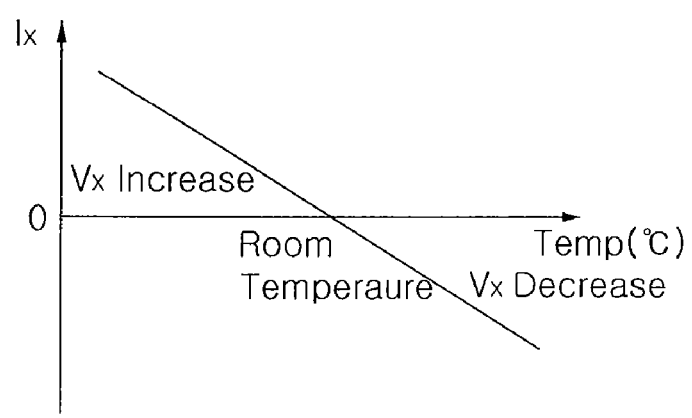

FIGS. 10A, 10B, and 10C are graphs showing changes in the $I_Q$, $V_X$, and $I_X$ according to a change in temperature in the operation mode 1 (supply+absorption mode), respectively.

Figure 11A:
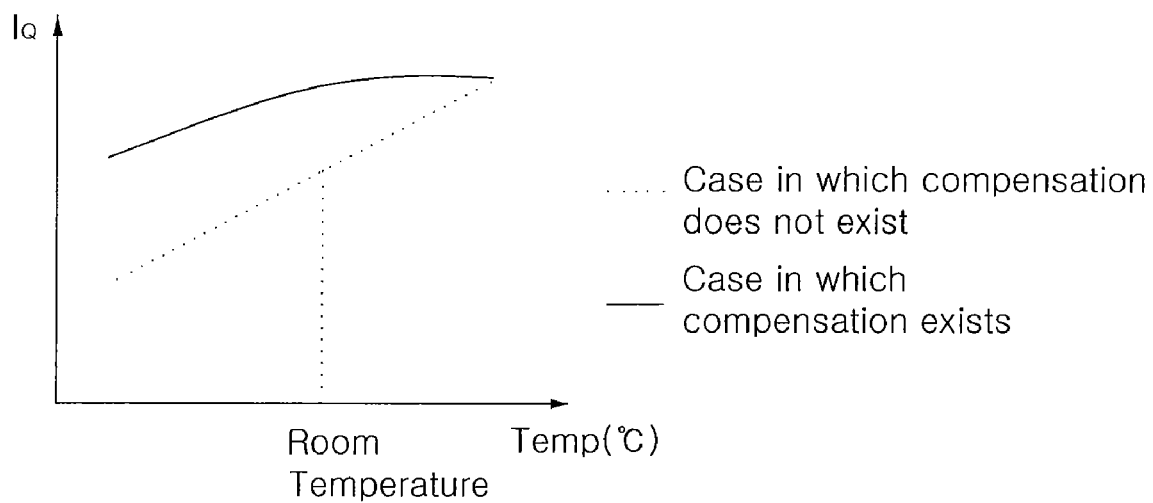
Figure 11B:
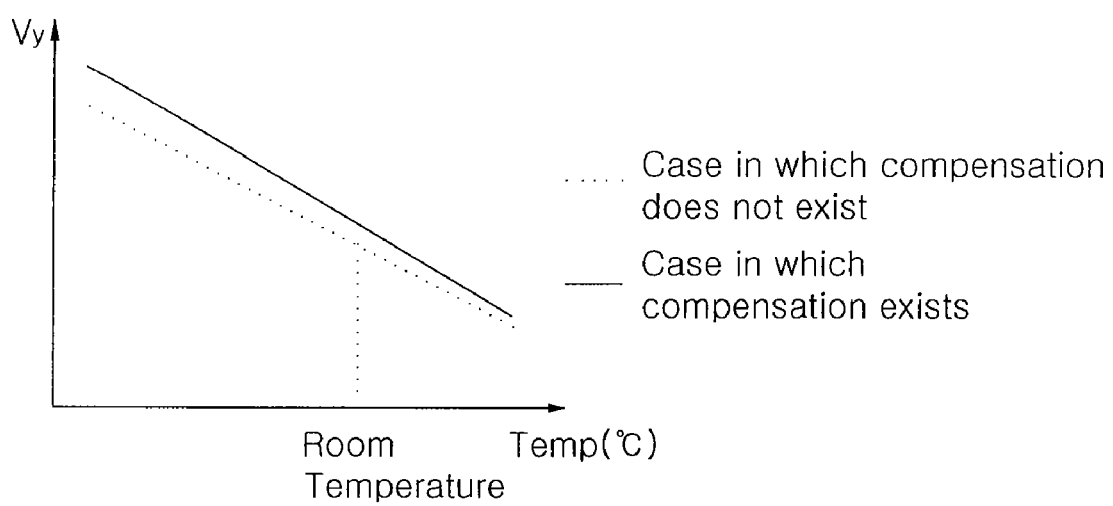
Figure 11C:
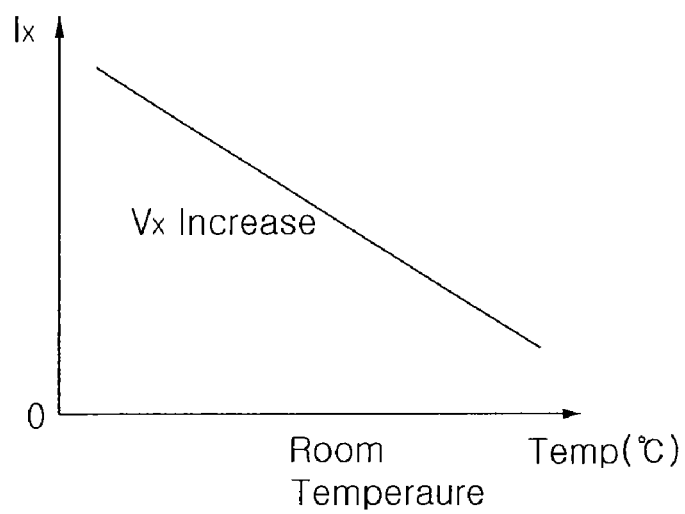

FIGS. 11A, 11B, and 11C are graphs showing changes in the $I_Q$, $V_X$, and $I_X$ according to a change in temperature in the operation mode 2 (supply mode), respectively.

Figure 12A:
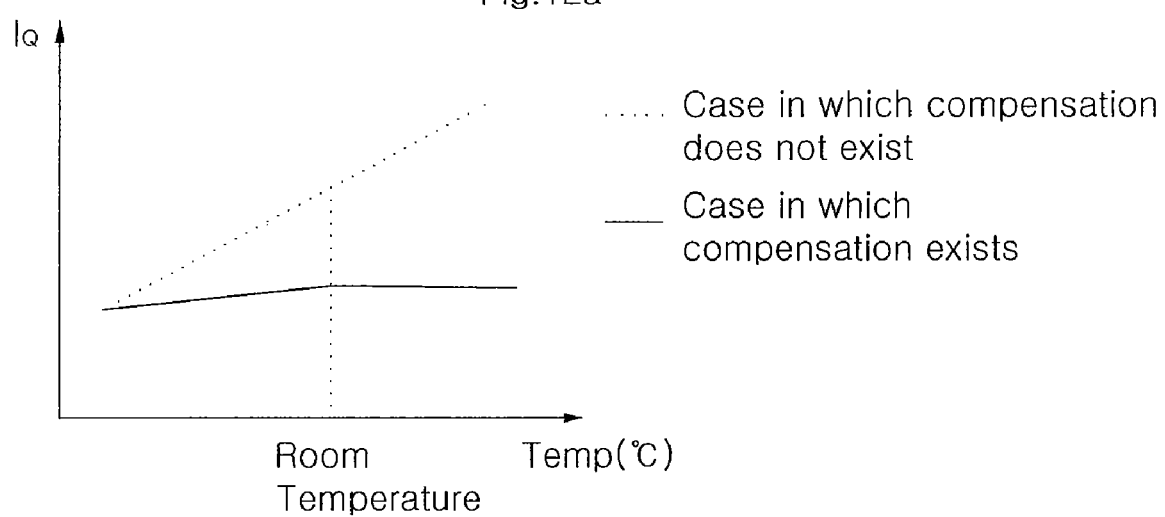
Figure 12B:
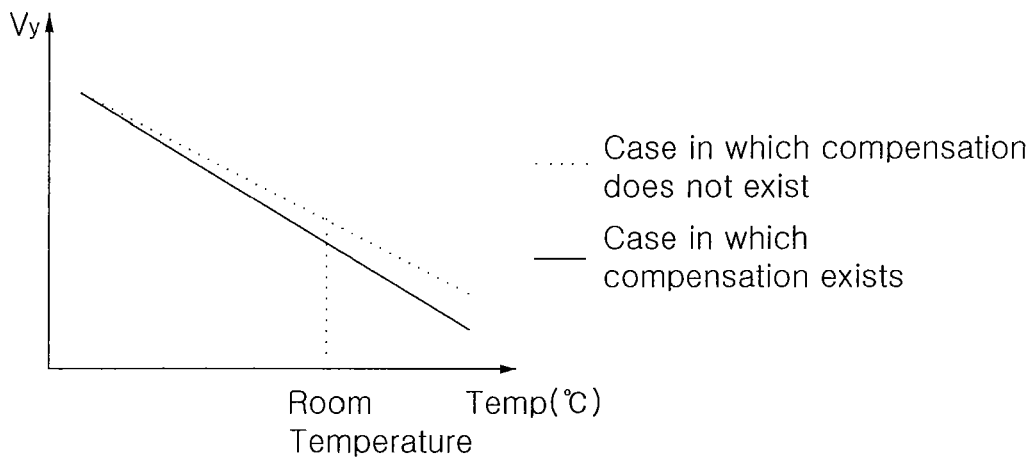
Figure 12C:
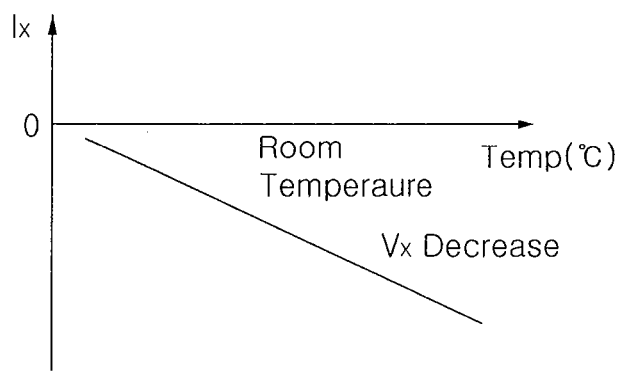

FIGS. 12A, 12B, and 12C are graphs showing changes in the $I_Q$, $V_X$, and $I_X$ according to a change in temperature in the operation mode 3 (absorption mode), respectively.

Figure 13:
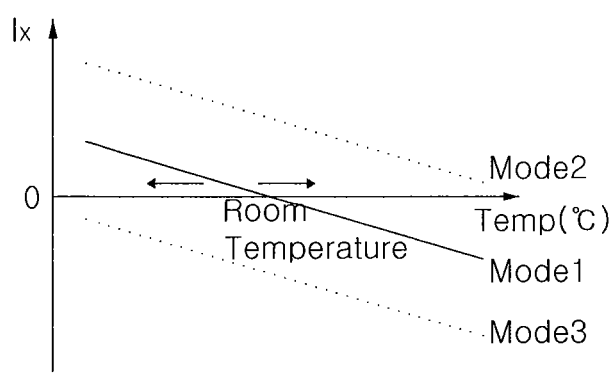
FIG. 13 is a graph showing changes of $I_x$ according to a change in temperature in the operation modes 1, 2, and 3.

FIG. 13 is a graph showing changes of the $I_X$ according to a change in temperature in the operation modes 1, 2, and 3. By adjusting the value of the voltage $V_{AUX}$, the current $I_X$ can be adjusted as shown in FIG. 13, which means that various applications are possible.

While this invention has been particularly shown and described with reference to preferred embodiments thereof, it will be understood by those skilled in the art that various changes in form and details may be made therein without departing from the spirit and scope of the invention as defined by the appended claims.

As described above, according to the temperature-compensated circuit according to the present invention, in spite of a change in temperature, the static operation current of the power amplifier is maintained at the room temperature (Mode 1), the value of the static operational current $I_Q$ at the highest temperature is maintained within a range allowed by the specification (Mode 2), and the value of the static operational current $I_Q$ at the lowest temperature is constantly maintained within the range allowed by the specification (Mode 3). Thus, unnecessary power consumption due to the power amplifier is prevented.

Furthermore, a portable wireless communication apparatus having the power amplifier according to the present invention has a longer talk time.

The embodiments of the present invention have been described above for purposes of illustrating the present invention. It is not intended to be exhaustive or to limit the invention to the precise form described. Many modifications and variations are possible in light of the teaching above. Accordingly, the scope of the invention is defined by the appended claims.

What is claimed is:

1. A temperature-compensated circuit for a power amplifier through diode voltage control comprising a first resistor (Rref), a first diode (D1), and a second diode (D2) are connected to reference voltage in series;
   a second resistor (R1) connected to the reference voltage;
   a third resistor (R2) connected to the second resistor in series;
   a fourth resistor (Rc) having one terminal connected to the reference voltage;
   a fifth resistor (Re) having one terminal connected to ground;
   a bias transistor having a base terminal connected to a contact point (VS) between the second resistor and the third resistor, a collector terminal connected to the other terminal of the fourth resistor, and an emitter terminal connected to the other terminal of the fifth resistor; and
   a sixth resistor (Rf) connected between a series connection terminal between the first diode and the second diode, and the collector terminal of the bias transistor, wherein the voltage of the collector terminal changes for compensation of a temperature.

2. The temperature-compensated circuit of claim 1, wherein the voltage of the collector terminal is determined by a voltage of a contact point between the second resistor and the third resistor.

3. The temperature-compensated circuit of claim 1, wherein the voltage of the collector terminal is changed by a value of the fourth resistor.

4. A temperature-compensated circuit for a power amplifier through diode voltage control comprises a first resistor (Rref), a first diode (D1), and a second diode (D2) are connected to a reference voltage in series;
   a third diode (D3) connected to the reference voltage;
   a second resistor (R1) connected to the third diode;
   a third resistor (R2) connected to the second resistor in series;
   a fourth resistor (Rc) having one terminal connected to the reference voltage;
   a fifth resistor (Re) having one terminal connected to ground;
   a bias transistor having a base terminal connected to a contact point (VS) between the second resistor and the third resistor, a collector terminal connected to the other terminal of the fourth resistor, and an emitter terminal connected to the other terminal of the fifth resistor; and
   a sixth resistor (Rf) connected between a series connection terminal between the first diode and the second diode, and the collector terminal of the bias transistor, wherein the voltage of the collector terminal changes for compensation of a temperature.

5. The temperature-compensated circuit of claim 4, wherein the voltage of the collector terminal is determined by a voltage of a contact point between the second resistor and the third resistor.

6. The temperature-compensated circuit of claim 4, wherein the voltage of the collector terminal is changed by a value of the fourth resistor.

7. A temperature-compensated circuit for a power amplifier through diode voltage control comprising a first resistor (Rref), a first diode (D1), and a second diode (D2) are connected to a reference voltage in series;
   a second resistor (R1) connected to the reference voltage;
   a third resistor (R2) connected to the second resistor in series;

a fourth resistor (Rc1) having one terminal connected to the reference voltage;

a fifth resistor (Rc2) connected to the fourth resistor in series;

a sixth resistor (Re) having one terminal connected to ground;

a bias transistor having a base terminal connected to a contact point (VS) between the second resistor and the third resistor, a collector terminal connected to the fifth resistor, and an emitter terminal connected to the other terminal of the sixth resistor; and a seventh resistor (RF) connected between a series connection terminal between the first diode and the second diode, and a series connection terminal between the fourth resistor and the fifth resistor, wherein the voltage of the collector terminal changes for compensation of a temperature.

8. The temperature-compensated circuit of claim 7, wherein the voltage of the collector terminal is determined by a voltage of a contact point between the second resistor and the third resistor.

9. The temperature-compensated circuit of claim 7, wherein the voltage of the collector terminal is changed by a value of the fourth resistor.

10. The temperature-compensated circuit of claim 7, wherein the voltage of the collector terminal is changed by a ratio between the fourth resistor and the fifth resistor.

11. A temperature-compensated circuit for a power amplifier through diode voltage control comprising a first resistor (Rref), a first diode (D1), and a second diode (D2) are connected to a reference voltage in series;

a third diode (D3) connected to the reference voltage;

a second resistor (R1) connected to the third diode;

a third resistor (R2) connected to the second resistor in series;

a fourth resistor (Rc1) having one terminal connected to the reference voltage;

a fifth resistor (Rc2) connected to the fourth resistor in series;

a sixth resistor (Re) having one terminal connected to ground;

a bias transistor having a base terminal connected to a contact point (VS) between the second resistor and the third resistor, a collector terminal connected to the fifth resistor (Rc2), and an emitter terminal connected to the other terminal of the sixth resistor; and a seventh resistor (Rf) connected between a series connection terminal between the first diode and the second diode, and a series connection terminal between the fourth resistor and the fifth resistor, wherein the voltage of the collector terminal changes for compensation of a temperature.

12. The temperature-compensated circuit of claim 11, wherein the voltage of the collector terminal is determined by a voltage of a contact point between the second resistor and the third resistor.

13. The temperature-compensated circuit of claim 11, wherein the voltage of the collector terminal is changed by a value of the fourth resistor.

14. The temperature-compensated circuit of claim 11, wherein the voltage of the collector terminal is changed by a ratio between the fourth resistor and the fifth resistor.

* * * * *

UNITED STATES PATENT AND TRADEMARK OFFICE
CERTIFICATE OF CORRECTION

| | | |
|---|---|---|
| PATENT NO. | : 7,310,015 B2 | Page 1 of 1 |
| APPLICATION NO. | : 10/905659 | |
| DATED | : December 18, 2007 | |
| INVENTOR(S) | : Jooyoung Jeon | |

It is certified that error appears in the above-identified patent and that said Letters Patent is hereby corrected as shown below:

Column 1, Line 4, (Approx.), under the Title, insert -- CROSS REFERENCE TO RELATED APPLICATIONS --;

Column 10, Line 32, Claim 4, delete "comprises" and insert -- comprising: --;

Column 10, Line 62, Claim 7, delete "comprising" and insert -- comprising: --;

Column 11, Line 12, Claim 7, delete "(RF)" and insert -- (Rf) --;

Column 11, Line 29, Claim 11, delete "comprising" and insert -- comprising: --;

Signed and Sealed this

Ninth Day of November, 2010

David J. Kappos
*Director of the United States Patent and Trademark Office*